United States Patent [19]

Starikov

[11] Patent Number: 5,276,337
[45] Date of Patent: Jan. 4, 1994

[54] ACCURACY OF ALIGNMENT AND O/L MEASUREMENT SYSTEMS BY MEANS OF TUNABLE SOURCE AND HANDLING OF SIGNAL

[75] Inventor: Alexander Starikov, Fishkill, N.Y.

[73] Assignee: International Business Machines Corporation, Armonk, N.Y.

[21] Appl. No.: 785,626

[22] Filed: Oct. 31, 1991

[51] Int. Cl.⁵ ............................................ G01N 21/86
[52] U.S. Cl. .................................... 250/548; 356/401
[58] Field of Search .............. 250/548, 557, 560, 561, 250/205; 356/399–401; 364/490, 559, 563

[56] References Cited

U.S. PATENT DOCUMENTS

| | | | |
|---|---|---|---|
| 4,639,604 | 1/1987 | Murakami et al. | 250/548 |
| 4,669,884 | 6/1987 | Bigelow et al. | 356/400 |
| 4,682,037 | 7/1987 | Kosugi | 250/548 |
| 4,769,680 | 8/1988 | Resor et al. | 355/43 |
| 4,777,641 | 10/1988 | Inagaki et al. | 378/34 |
| 4,906,852 | 3/1990 | Nakata et al. | 250/548 |
| 4,929,083 | 5/1990 | Brunner | 356/400 |
| 5,028,797 | 7/1991 | Abe et al. | 356/401 |
| 5,124,562 | 1/1992 | Kawashima et al. | 250/548 |

OTHER PUBLICATIONS

K. A. Chivers, "A Modified Photoresist Spin Process for a Field-by-Field Alignment System" Proceedings, Kodak Microelectronics Seminar, pp. 44-51 San Diego, CA (Oct. 29-30, 1984).

M. S. Wanta, et al "Characterizing New Darkfield Alignment Target Designs" Proceedings, Kodak Microelectronics Seminar, pp. 169-181 San Diego, CA (Nov. 19-20, 1987).

C. P. Kirk, "Theoretical Models for the Optical Alignment of Wafer Steppers" SPIE vol. 772, pp. 135-141 Optical Microlithography VI, (1987).

"Structures for Test of Asymmetry in Optical Imaging Systems" IBM Technical Disclosure Bulletin, vol. 33, No. 5, pp. 114-115, (Oct. 1990).

C. Lambson et al., "Alignment Mark Optimization for a Multi-Layer-Metal Process" Proceedings, KTI Microlithography Seminar, pp. 37-52 San Jose, CA (Oct. 14-15, 1991).

Primary Examiner—David C. Nelms
Assistant Examiner—Stephone B. Allen
Attorney, Agent, or Firm—Graham S. Jones, II; Charles W. Peterson, Jr.

[57] ABSTRACT

A method and apparatus is provided for estimating the centerline of an alignment/overlay measurement target by means of projecting light from a tunable, variable wavelength the illumination source onto the target, then performing optical observation of the measurement mark and providing an output signal representing the quantity measured in the observation, computing from the output signal a criterion of signal asymmetry to provide an output product, and tuning the tunable illumination source as a function of the output product. As a result tuning adjustment of the wavelength of illumination is employed to expose an observed feature, and the illumination source is tuned until the criterion is minimized, thus improving the accuracy of the estimated centerline.

3 Claims, 9 Drawing Sheets

ACCURACY OF ALIGNMENT AND O/L MEASUREMENT SYSTEMS BY MEANS OF TUNABLE SOURCE AND HANDLING OF SIGNAL

BACKGROUND OF THE INVENTION

1. Field of the Invention

This invention relates to microlithography, and more particularly to alignment of masks/reticles to wafers/substrates and to measurement of overlay.

2. Description of Related Art.

In microlithography, difficulties exist in accurate measurement of overlay (O/L), which comprises the degree of misalignment between successive layers of patterns on a thin film electronic structure and in aligning the masks/reticles used to print such layers to preceding layers. From a slightly different point of view, difficulties exist in accurate estimation of centerlines in the context of optical alignment and overlay (O/L) measurements. Inaccuracies of O/L measurement and alignment are introduced by asymmetrical, nonuniform coating of resist in deposition (spin-on is typical) over O/L and alignment marks/targets. For example, spin-on deposition of resist yields peaks and valleys in the resist which are asymmetric in reference to underlying topography. As a result, images of such marks below are themselves asymmetric, making estimation of centerlines ambiguous and inaccurate.

Nakata, U.S. Pat. No. 4,906,852 uses a variable path length delay to offset the phase of one signal in reference to another. The first is that of a wafer alignment mark and the second is that of a planar area in proximity. Spatial and temporal coherence of light are essential to achieve strong isolation of the reflection off the bottom of photoresist. The assumption that reflection being the strongest one is made and is also crucial for operability. A mechanical motion or the equivalent to vary the length of the delay path of the Mach-Zehnder interferometer is required.

Starikov, IBM Technical Disclosure Bulletin, Vol. 33, No. 5 (Oct. 1990) pp 114-5 "Structures for Test of Asymmetry in Optical Imaging Systems" discusses testing asymmetry of optics for optical lithography, alignment, and measurement of overlay and size.

Studies of sensitivity of various alignment systems to asymmetry in photoresist coverage, such as Chris P. Kirk, "Theoretical Models for the Optical Alignment of Wafer Steppers", SPIE, Vol. 772, Optical/Microlithography VI (1987) pp. 134-141, (referred to hereinafter as Kirk '87) exist suggesting errors up to 1 μm for some bright field monochromatic alignment systems.

For one such system considerable errors of alignment have, in fact, been reported, for example, K. A. Chivers, "A Modified Photoresist Spin Process for a Field-by-Field Alignment System" Kodak Microelectronics Seminar, Proceedings Oct. 29-30, 1984, San Diego, Calif., pp 44-51.

Some makers of alignment systems ("Wanta '87": M. D. Wanta et al, "Characterizing New Darkfield Alignment Target Designs", KTI Microelectronics Seminar, Interface '87, Proceedings Sponsored by KTI Chemicals, Inc. San Diego, Calif., (Nov. 19-20 1987) pp. 169-181) and ("Lambson '91": C. Lambson and A. Awtrey, "Alignment Mark optimization for a Multi-Layer-Metal Process", KTI Microlithography Seminar, Interface '91, Proceedings Sponsored by KTI Chemicals, Inc. San Diego, Calif., (Oct. 14-15 1991) pp. 37-52) have considered the use of signal symmetry as a measure of goodness of alignment targets, when the asymmetry is due to the process of mark formation, such as in metallization levels.

In the case of alignment by commercially available systems there is a difficulty with the wafer alignment marks, whose centerline is estimated in reference to the mask/reticle marks.

Figure 1:
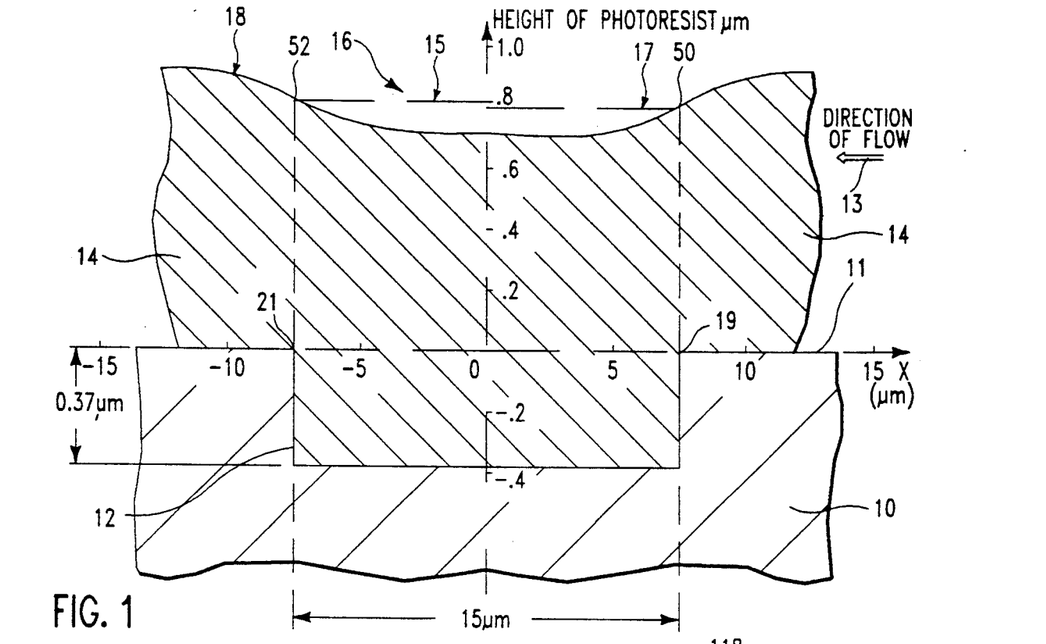
FIG. 1 is a schematic drawing of a sectional view of a substrate in the form of a wafer with a wafer alignment mark.

FIG. 1 shows a sectional view of a substrate 10 in the form of a wafer with a wafer alignment mark 12 illustrated here in the form of a hollow space (which alternatively can be a rise) on the upper surface 11 of substrate 10, which extends along the x axis of the drawing. The illustrative example of a mark 12 is about 15 μm wide and about 0.37 μm deep and coated with a layer of photoresist 14 about 1 μm thick along the y axis which at the time of spin-on deposition was flowing from right to left, parallel to the x axis, as indicated by arrow 13. Some of the photoresist 14 is deposited within the depression formed by the mark 12, leaving a depression 16 in the upper surface 18 of the photoresist 14. It can be seen that the heights of the photoresist 14 are different, at level 17 at the leading edge 50 and at level 15 (a little higher than level 17) at the trailing edge 52 directly above the leading and trailing edges 19 and 21 of mark 12. The resulting difference is in mark reflectivity over the leading and trailing edges is the source of the image asymmetry in bright field viewing of the mark.

Figure 2:
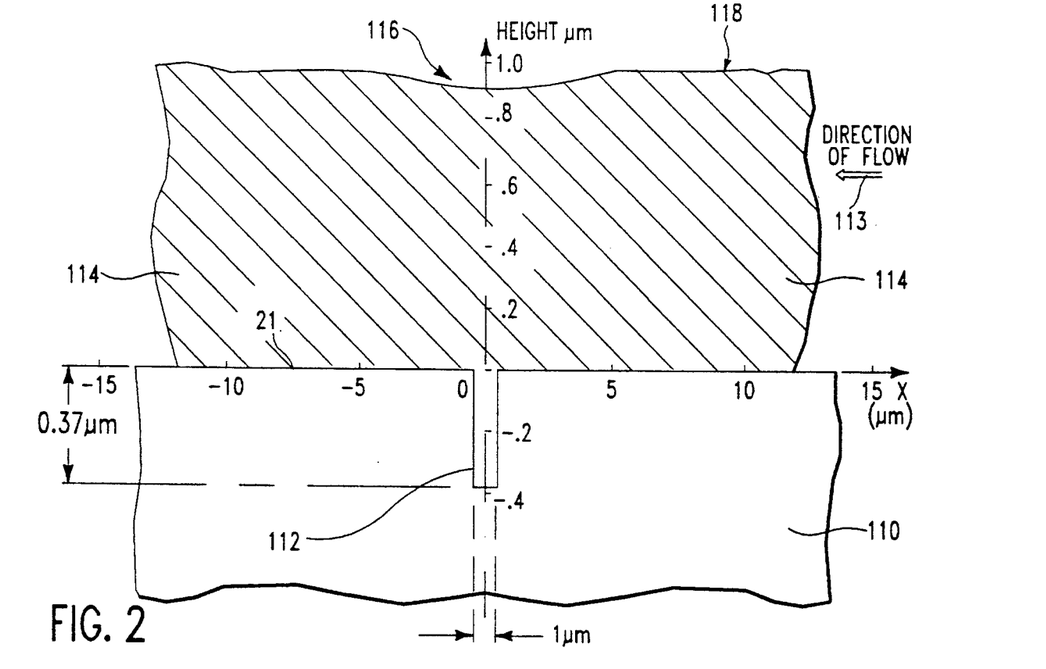
FIG. 2 shows a modification of FIG. 1 with a narrower alignment mark.

FIG. 2 shows a modification of FIG. 1 with a different mark 112 on substrate 110 only 1 μm wide with the thickness of the resist 14 the same and the depth of the mark 112 the same as mark 12. Note that the depression 116 in the upper surface 118 of the resist 114 over the mark 112 is much smaller than that over mark 12, indicating better planarization. Also, notice the apparent improvement in symmetry of the resist top surface over the mark.

SUMMARY OF THE INVENTION

In accordance with this invention, a new method of estimating the centerline of an alignment/overlay measurement target includes the steps as follows:

a) applying illumination to the target while adjusting the wavelength of the illumination, b) performing optical observation of alignment/overlay measurement mark in which tuning adjustment of the wavelength of illumination is employed to expose an observed feature, and c) computing a criterion of signal asymmetry and accordingly tuning the illumination source until the the criterion is minimized.

Further in accordance with this invention, a method of estimating the centerline of an alignment/overlay measurement target by means of the steps as follows:

a) projecting light from a tunable, variable wavelength illumination source onto the target, b) performing optical observation of the measurement mark and providing an output signal representing the quantity measured in the observation, c) computing from the output signal a criterion of signal asymmetry to provide an output product, d) tuning the tunable illumination source as a function of the output product, whereby tuning adjustment of the wavelength of illumination is employed to expose an observed feature, and the illumination source is tuned until the criterion is minimized.

In another aspect of this invention, apparatus for estimating the centerline of an alignment/overlay measurement mark on a workpiece comprises
a) a tunable, variable wavelength illumination source having an input terminal,
b) means for projecting light from the illumination source onto the target,
c) sensing means for performing optical observation of the measurement mark and providing an output signal,
d) means for computing a criterion of signal asymmetry having an input for receiving the output signal from the sensing means,
e) the means for computing providing a tuning signal to the input terminal of the tunable illumination source, whereby tuning adjustment of the wavelength of illumination is employed to expose an observed feature, and the illumination source is tuned until the criterion is minimized.

BRIEF DESCRIPTION OF THE PREFERRED EMBODIMENTS

Figure 3:
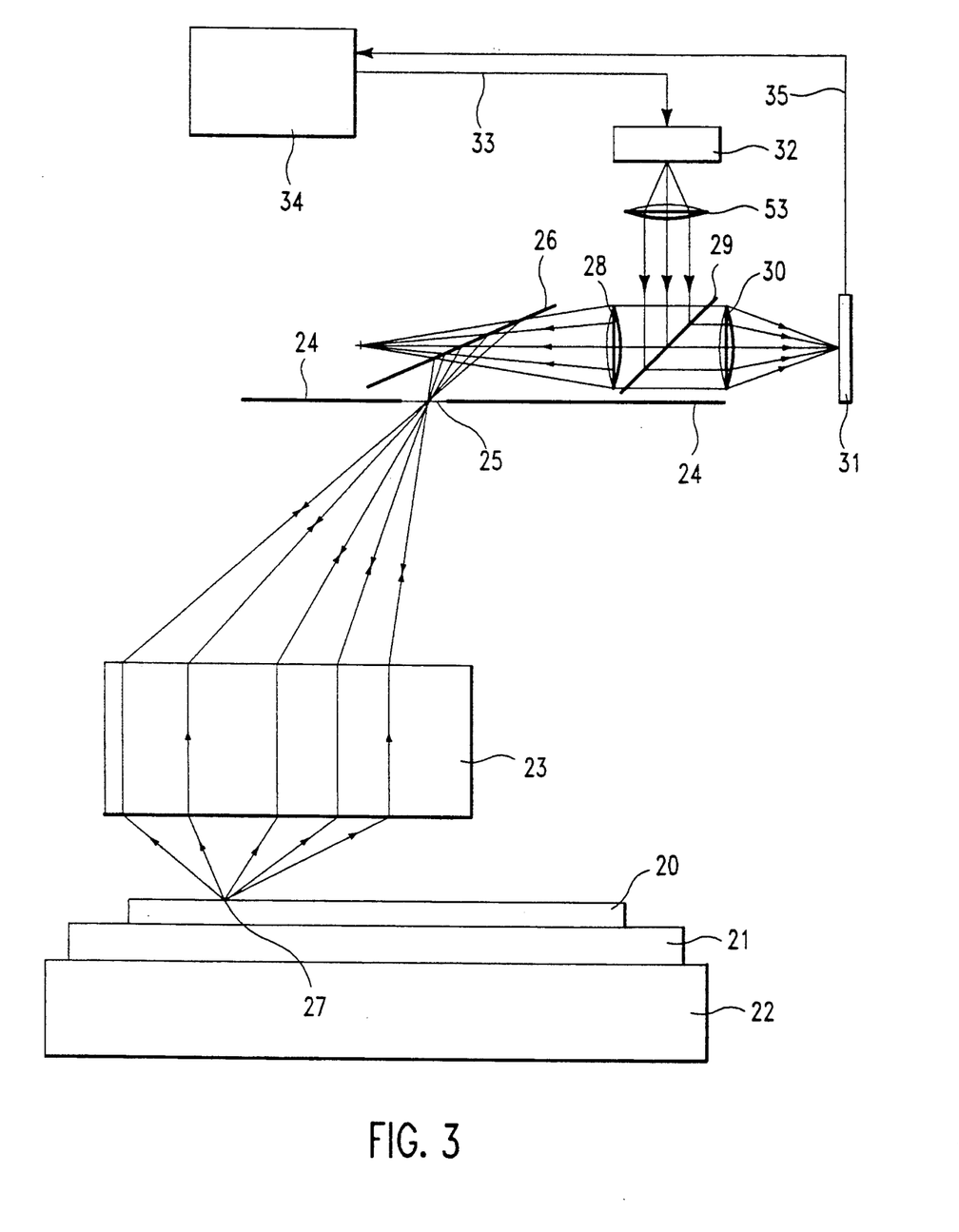
FIG. 3 shows an alignment system in accordance with this invention.

FIG. 3 shows an alignment system in accordance with this invention. The system of FIG. 3 is a modification of a commercially available bright field monochromatic alignment system operating through the lens with full field imaging, using bright field illumination. A wafer 20 is supported upon a wafer chuck 21 supported by an table 22 with X and Y stages, which could also include Z and Θ stages. In accordance with this invention, a computer 34 controls a variable wavelength light source 32 via control line 33 to provide the new feedback system of this invention. The light source 32 is preferably a tunable laser, such as a dye laser or a tunable incandescent source such as is achieved with a tunable monochromator. Light source 32 produces light which passes through a lens 53 to a beam splitter 29, which is reflected by mirror 26 through a reticle alignment mark in the form of an aperture 25 in reticle 24 to pass through an imaging lens 23. The imaging lens 23 (which is frequently a reduction lens) illuminates a wafer alignment target 27 on the surface of wafer 20. The light reflected from wafer alignment mark 27 on wafer 20 passes back up through the imaging lens 23, back through the reticle alignment mark 25 in reticle 24, reflected by mirror 26 through relay lens 28 and through the beam splitter 29 and through relay lens 30 to be received and detected by video camera 31, which comprises a camera with a technology such as CCD or the like. Line 35 from video camera 31 is connected to computer 34 for the purpose of providing signals indicating the presence of alignment marks 25, 27, etc. used for estimating the centerlines of reticle mark 25 and wafer mark 27, and, finally, for estimating the relative displacement of the centerline of the mark 25 in reference to mark 27, called alignment offset.

Illumination used here may be spatially coherent or incoherent (as shown in the drawings.) In the case of coherent illumination, e.g. laser illumination, only the ray on the axis is present in the illumination path. The light is also usually monochromatic (temporarily coherent) with its bandwidth narrow and the center of the band being fixed (e.g. HeNe or HeCd, and equivalent lasers, or actinic light.)

Display of images of wafer and reticle alignment marks is afforded separately when full field imaging is used (as drawn) or combined image is obtained by scanning an image of a narrow reticle mark across the wafer mark using either the x, y wafer stage, reticle stage, or scanning of the illumination beam.

Figure 4A:
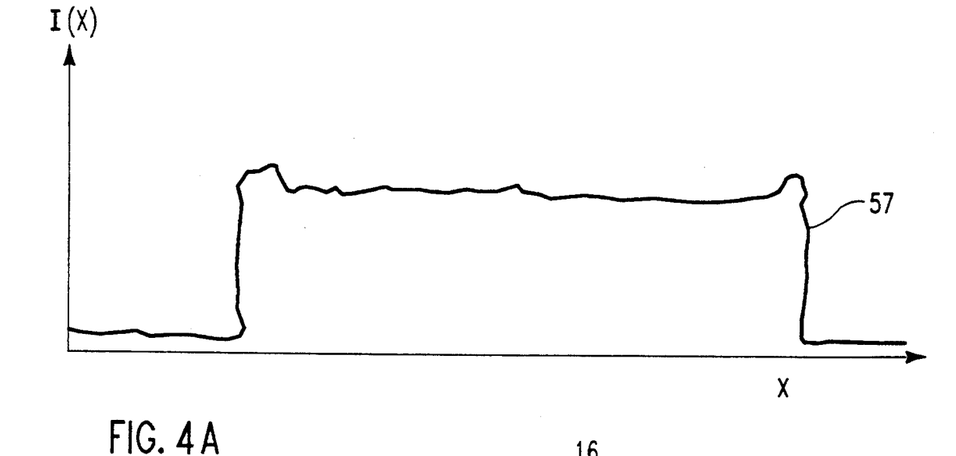
FIG. 4A shows a graph of the intensity of a illumination I(x) on a wafer surface as a function of coordinates along the x axis of a sample shown in FIG. 4B.
Figure 4B:
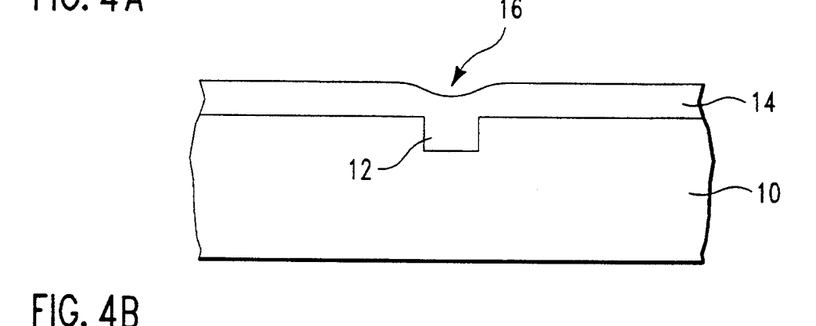
FIG. 4C shows the image I(x) of an alignment signal in the form of an electronic image of the reticle (mask) with respect to the wafer alignment mark.
Figure 4C:
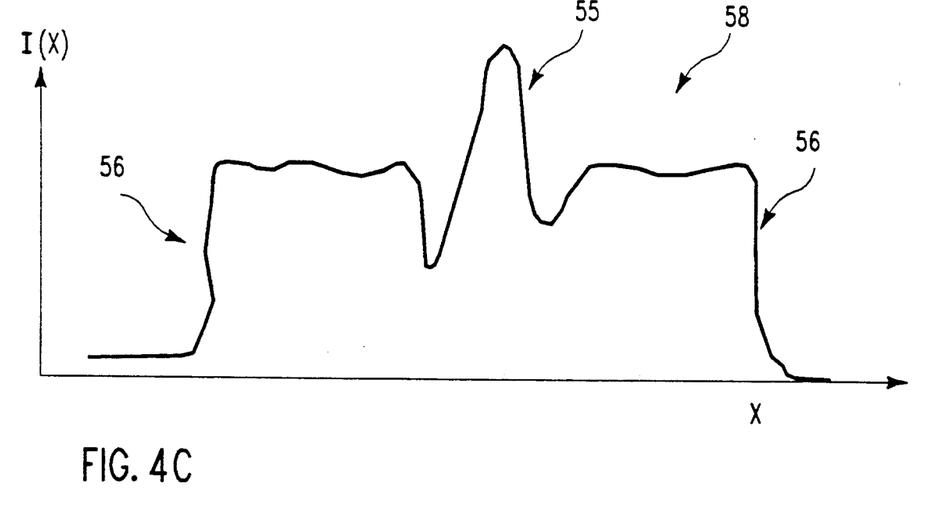

FIG. 4A shows a graph of the intensity of a illumination I(x) on a wafer surface as a function of coordinates along the x axis of a sample shown in FIG. 4B. The pulse representing the reticle alignment signal mark 57 shown in FIG. 4A represents an electronic signal in response to the image of a reticle (mask) alignment mark 25 on wafer 20 in FIG. 3. In FIG. 4B, the wafer alignment mark 12 is shown on the surface of a wafer substrate 10. FIG. 4C shows the image I(x) of an alignment signal in the form of an electronic image of the reticle (mask) with respect to the wafer alignment mark. Substrate 10 is analogous to the devices of FIGS. 1, 2 (which shows a sectional view of a wafer coated with photoresist.) FIGS. 1, 2 and 4B show a wafer alignment mark 12 beneath resist 14 with the top surface of the resist 14 having a depression 16 over the location of alignment mark 12 beneath the resist 14. FIG. 4C shows another graph of the electronic image in the form of alignment signal 58. Alignment signal 58 represents image intensity (represented by signal I(x)) from mark 12 as a function of a representation of an alignment mark 12 by signal 55. Images of the wafer alignment mark extend to the peak near the center of the signal from the reticle alignment mark. The edges of the wafer alignment mark 12 in FIG. 4B are represented by the portions 55 of the signal. Images of the edges of the reticle mark 12 are shown where the signal in FIG. 4C 56 rises and falls at ends 56 of alignment signal 58.

Figure 5:
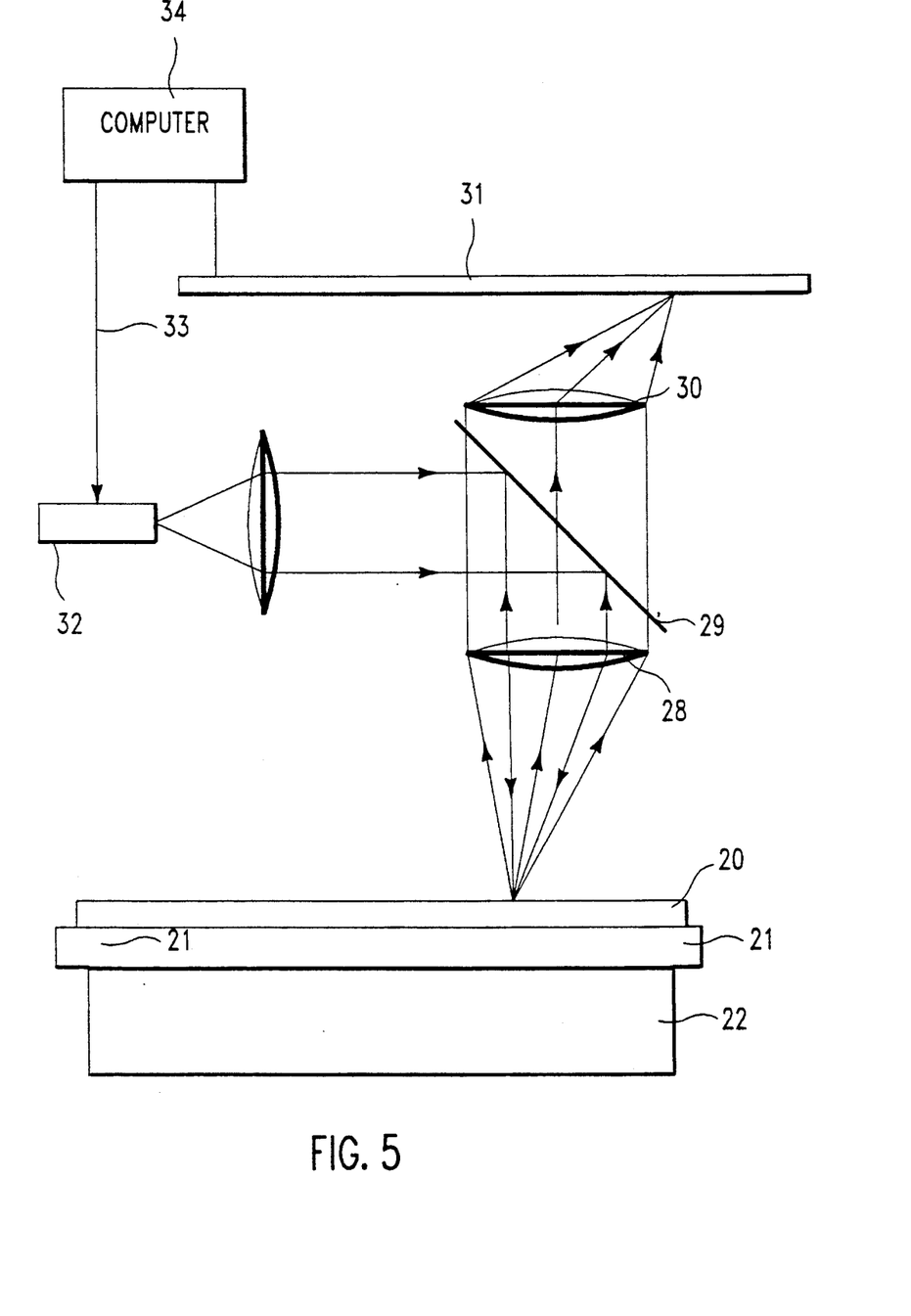
FIG. 5 shows a conventional bright field microscope apparatus with a CCD camera, modified in accordance with this invention, for measurement of overlay, similar to FIG. 3.
Figure 6A:
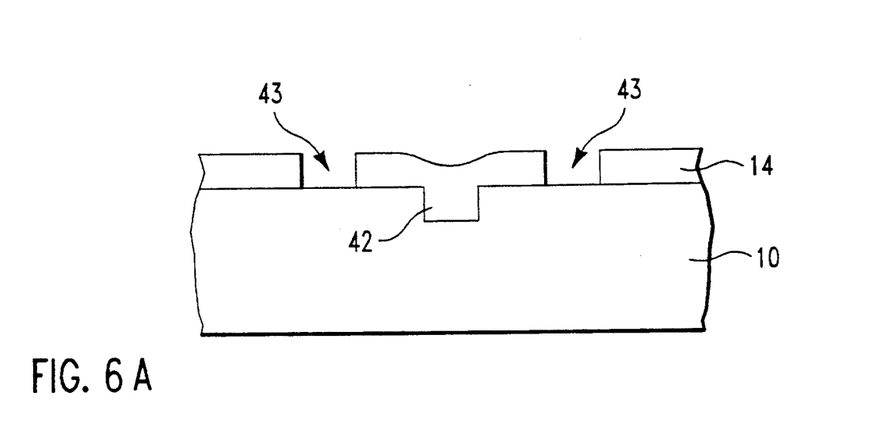
FIGS. 6A and 6B relate to the apparatus of FIG. 5 and show a section in FIG. 6A analogous to the one shown in FIG. 4B with a target (substrate) portion of the overlay measurement mark.
Figure 6B:
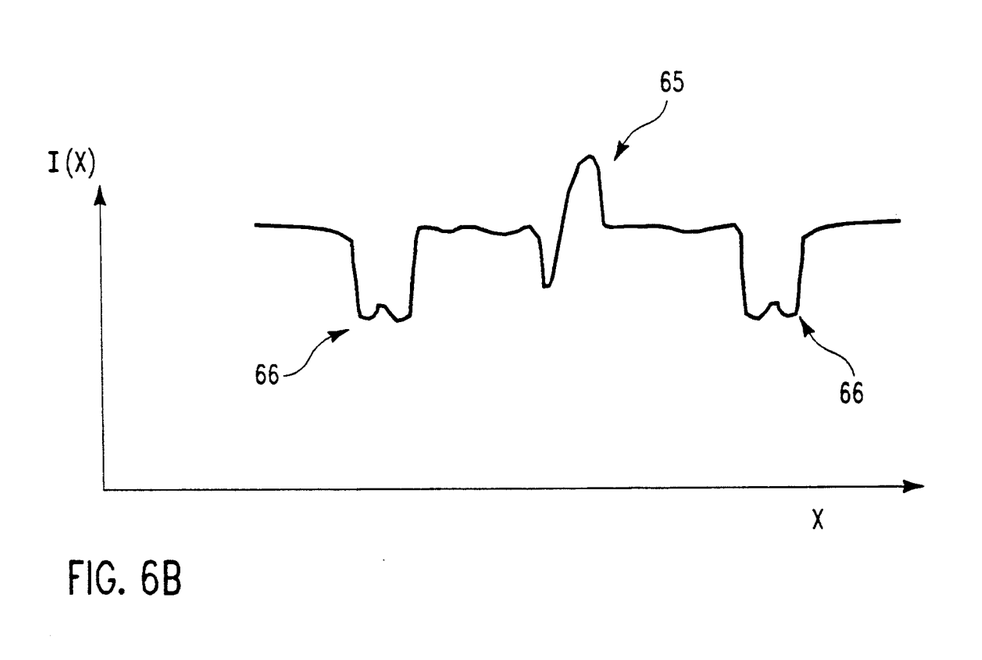

In O/L measurement, as illustrated by FIGS. 5 and 6 the difficulty is usually in estimating the centerline of the prior level (target) mark 42 in FIG. 6A in reference to the consequently patterned pair of bars 43 representing the bullet mark in the photoresist 14 in FIG. 6A. FIG. 5 shows a conventional bright field microscope apparatus with a CCD camera, typically used for measurement of overlay, with similar parts numbered similarly to FIG. 3, and modified with feedback loop 53 in accordance with this invention. In the case of O/L measurements both marks whose centerlines are being compared are on the wafer, thus simplifying the apparatus. FIGS. 6A and 6B relate to the apparatus of FIG. 5 and show a section in FIG. 6A analogous to the one shown in FIG. 4B with a target 42 (substrate) portion of the overlay measurement mark. Bullet mark bars 43 in the photoresist 14 are the resist portion of the overlay mark which are represented by dips 66 in the image I(x) in FIG. 6B. The image of the target mask 42 is shown by the rise 65 in FIG. 6B.

Inaccuracies of alignment and O/L measurement are usually introduced by asymmetrical coating of resist 14 in deposition over wafer alignment mark 12 in FIG. 4B and O/L measurement mark 42 in FIG. 6A. For example, photoresist spin coated over mark 42 produces a coating profile, neither planar nor conformal in reference to the underlying topography, with asymmetry as illustrated by FIGS. 1 and 2 affecting estimation of mark centerlines.

Figure 7:
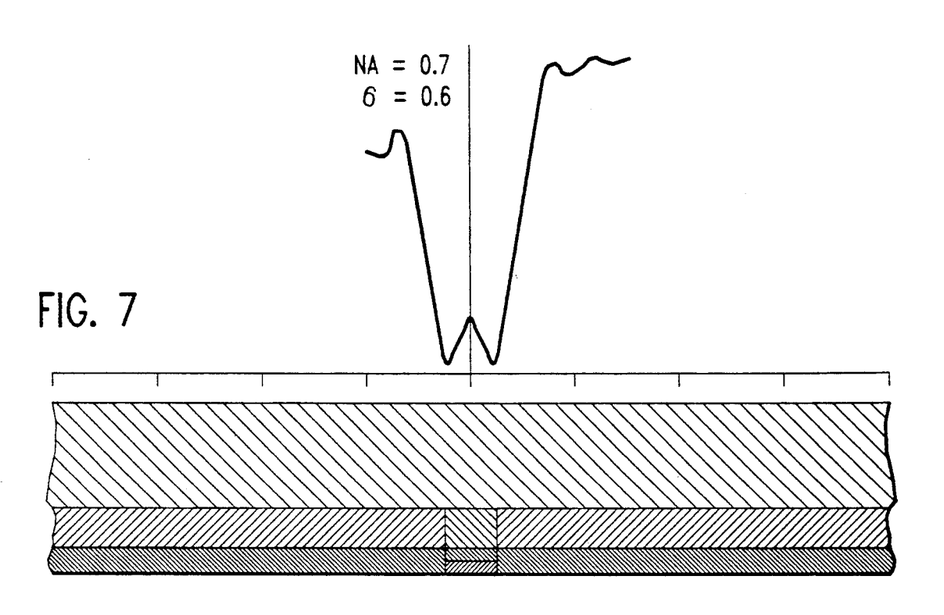
FIG. 7 illustrates the viewing of an 0.8 μm wide mark through non-planar photoresist at 546 nm wavelength of light.
Figure 8:
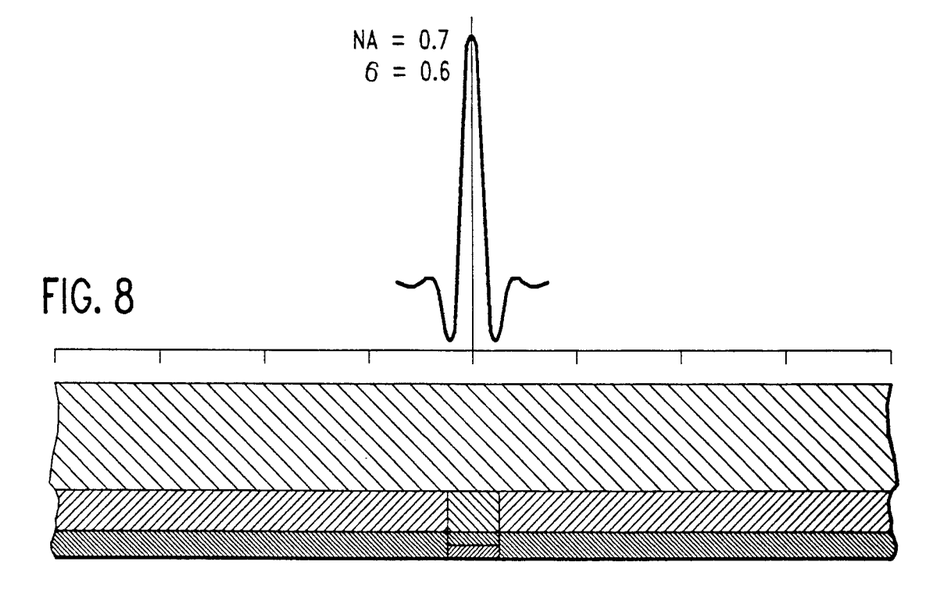
FIG. 8 illustrates the viewing of an 0.8 μm wide mark through non-planar photoresist at 563 nm.
Figure 9A:
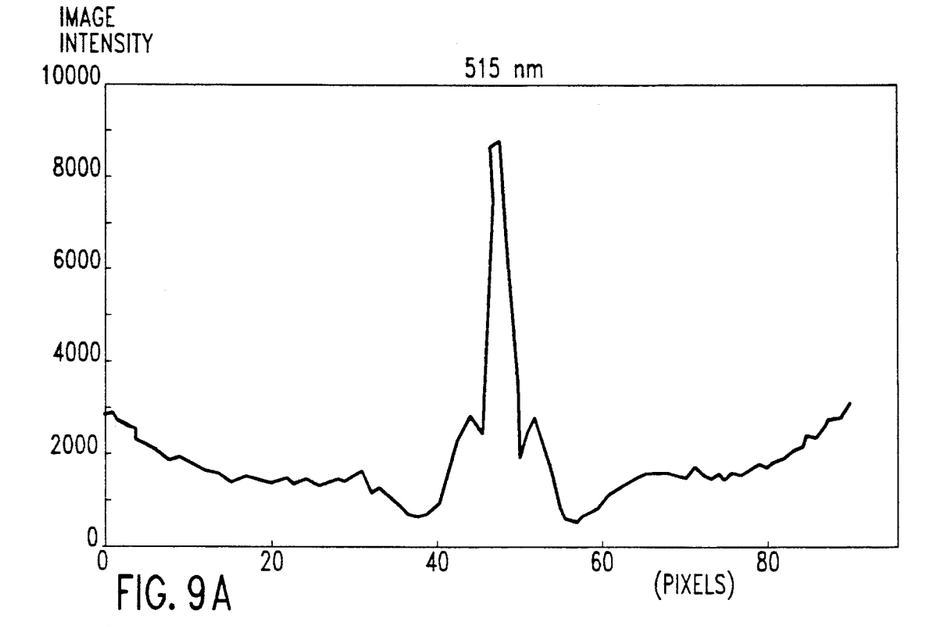
FIGS. 9A to 9D shows graphs of image intensity vs. pixel number at substantially monochromatic radiation wavelengths of 515 nm, 546 nm, 577 nm and 633 nm for a 1 μm wide trench target such as FIG. 2.
Figure 9B:
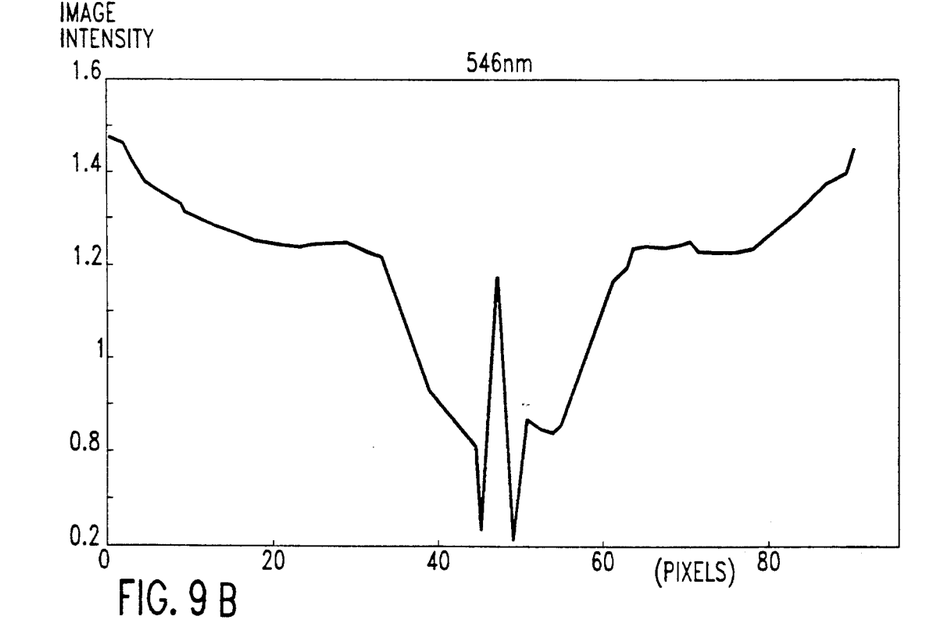
Figure 9C:
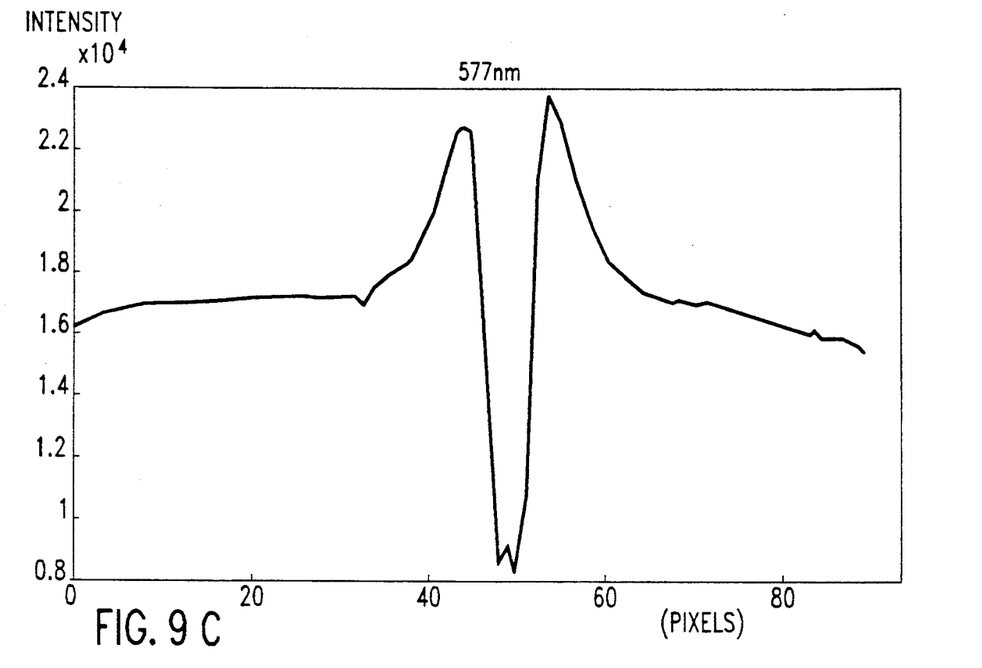
Figure 9D:
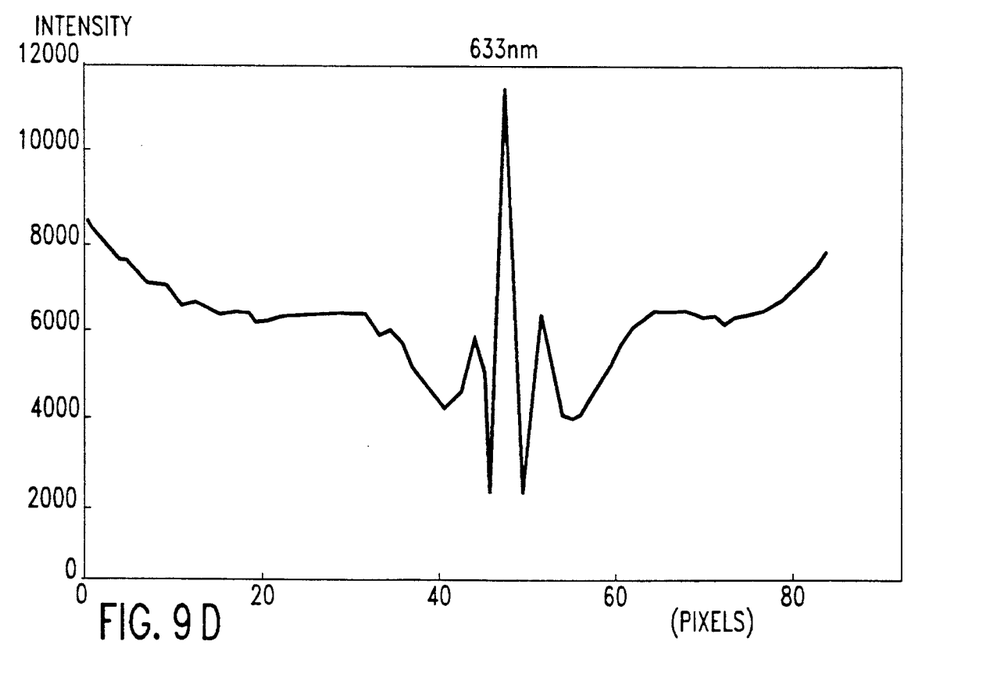

This invention employs the technique of variation of the illumination band (monochromatically or within a finite bandwidth) or the equivalent until measurements of a figure of merit associated with a degree of asymmetry of the image of a mark under photoresist is minimized, as illustrated by computer simulations the results of which are shown in FIGS. 7 and 8. That is, the illumination frequency is tuned until the degree of asymmetry reaches a minimum value. This is realized by the feedback on line 33 in FIG. 3 for alignment or O/L measurement in FIG. 5 such that tuning the source is done to minimize a measure of image asymmetry on camera 31 produced by the wafer (target) alignment mark viewed through asymmetric photoresist.

FIG. 7 illustrates the viewing of an 0.8 $\mu$m wide mark through non-planar photoresist at 546 nm.

| Threshold | 20% | −.014 $\mu$m offset |
|---|---|---|
| | 30% | −.019 $\mu$m |
| | 40% | −.027 $\mu$m |
| | 50% | −.050 $\mu$m |
| | "walk" | 36 nm |

The estimates of centerline are made at various intensity thresholds in the mark image. While inaccuracy varies from −14 to −50 nm, the corresponding measure of image asymmetry, the uncertainty about location of center, is 36 nm (given the range of used thresholds.)

Referring to FIG. 8, following a detuning from 546 nm wavelength to 563 nm the symmetry of the image of the same mark has improved: for thresholds from 50% to 90% the inaccuracy is only −5 nm to −4 nm and the corresponding uncertainty about the centerline, or centerline "walk" is only 1 nm. The necessary tuning was only 17 nm from the initial wavelength of 546 nm, 3%.

| Threshold | 50% | −.005 $\mu$m offset |
|---|---|---|
| | 60% | −.005 $\mu$m |
| | 70% | −.004 $\mu$m |
| | 80% | −.004 $\mu$m |
| | 90% | −.004 $\mu$m |
| | "walk" | .001 $\mu$m |

This shows that tuning the source until image asymmetry is minimized results in improved accuracy in estimation of the centerline. The same principle is applicable to both alignment and O/L measurements.

The maximum detuning in order to minimize image asymmetry can be estimated using the following consideration. A complete image contrast reversal (and reversal of corresponding asymmetry in the interference fringe) will occur for a path length delay Lambda/2 between the light reflected at the top of the resist (18 in FIG. 1) compared to that at the bottom (11, FIG. 1). only less than half of that is needed to minimize asymmetry in the direction of least detuning. Therefore, if the initial wavelength were Lambda$_O$, thickness of photoresist d, refractive index n, then the detuning of Delta-Lambda can be found from $$\tfrac{1}{2} = 2dn(1/\text{Lambda}_O - 1/(\text{Lambda}_O + \text{Delta} - \text{Lambda}))$$

Assuming Delta-Lambda is much less than Lambda$_O$ $$\text{Delta} - \text{Lambda} = (\text{Lambda}_O)^2/8dh$$

In our example
Lambda$_O$=0.546 $\mu$m,
d=1 $\mu$m, n=1.64, and
The estimate of Delta-Lambda=0.023 $\mu$m, consistent with our modelled detuning of 17 nm.

In practice, the amount of detuning would decrease with increased thickness of photoresist, increase in resist refractive index or with decrease in wavelength of illuminating light. For example, if we chose to align at 0.2 $\mu$m (such as in the case of an excimer based lithography), the maximum detuning needed would be only Delta−Lambda≈0.003 $\mu$m.

Examples of experimental proof are illustrated in FIGS. 9A to 9D which represent graphs of image intensity vs. pixel number at 515 nm, 546 nm, 577 nm and 633 nm wavelength radiation for a 1 $\mu$m wide trench target such as FIG. 2. The signals clearly show the varying degree of asymmetry as illumination wavelength is adjusted, so tuning can be used to minimize the degree of asymmetry.

Advantages

This invention has the advantage of improving accuracy of alignments and O/L measurements. It makes the detected signal more symmetric by tuning the observation wavelength and by making use of criteria of goodness based on signal symmetry, and, in principle, on signal strength, edge acuity, image contrast and signal type.

The technique may also be used to test the optics used for O/L or alignment for sensitivity to the mark asymmetry (either in assembly and manufacture or when in actual use) or to test the asymmetry of the O/L or alignment targets (either as the part of target design/selection or in the actual use).

Furthermore, the method may be incorporated into execution of the O/L measurement or alignment algorithms either to correct the measurement/alignment position or to skip a site deemed too poor by the goodness criterion.

Adjustments of parameters, not introducing, on their own, asymmetries into the imaging system can be done. The parameters which can be adjusted include such parameters as wavelength, positions or shapes of optical elements (lenses, prisms, mirrors, axial positions, etc., as well as other essential optical elements such as polarizer/analyzer, apertures etc.) Such adjustments lead to improvement of the criterion of goodness and result in improved symmetry of both the optics and the image of the target, thus leading to better accuracy through optimal viewing of the asymmetric targets. Other than the centerline walk, other criteria of goodness contemplated for use in this invention include inter alia as follows:

1) normalized image covariance at its peak,
2) a comparison of image intensities at estimated edge locations,
3) reflectivity of area adjacent to either side of the alignment target.

Alternatives

Block-out/ablation of resist; asymmetries of dielectrics over marks still remain ... process step. Contamination and extra handling of wafers are undesirable from the yield standpoint.

Design of marks for maximum symmetry. Difficult to do, slow turn around time. This method is instrumental for evaluation of improvement via estimating signal asymmetry and improving upon the potential of that design with the base imaging system by using the mark at a wavelength yielding the least asymmetry.

Dark field, first order diffraction interferometer imaging systems are less susceptible (Kirk '87 above) to inaccuracies caused by asymmetry of the kind shown in FIGS. 1, 2.: but these methods have other difficulties of their own, making a bright field illumination system desirable in some applications, such as grainy metals and the like.

Figure 10:
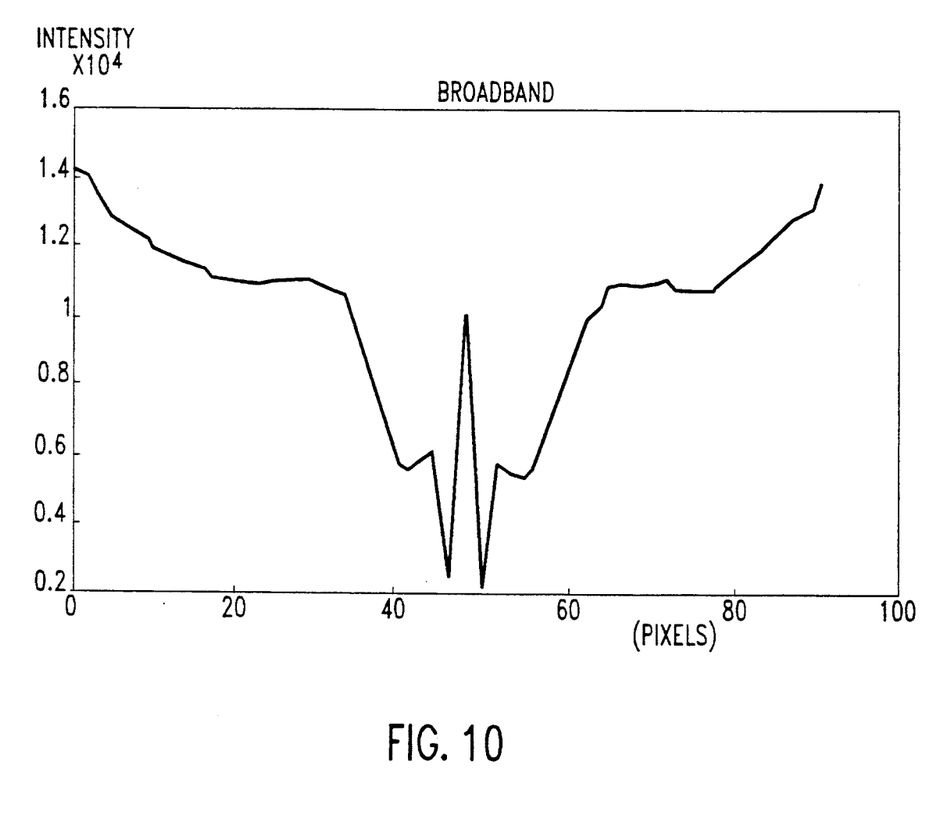
FIG. 10 shows a graph similar to FIGS. 9A-9D but for a broadband spectrum of radiation.

Polychromatic illumination (temporally incoherent light) provides a way of averaging estimates of centerlines by using all images as proposed, but in a composite polychromatic image; however, once the band is fixed, some degree of asymmetry remains as illustrated in FIG. 10, which is similar to FIGS. 9A-9D but in FIG. 10 for a broadband spectrum of radiation, and it is impossible to improve the accuracy any further without tuning in accordance with this invention. The proposed tunable source requires much less detuning than the bandwidth of the polychromatic systems, thus making it possible to more easily integrate the proposed alignment system into the stepper. The need for chromatic aberration correction is reduced for both alignment and O/L measurement applications. Broad band polychromatic bright field alignment may be incompatible with through the lens alignment or with schemes using lasers with fixed wavelength to enhance the signal-to-noise ratio, because through the lens alignment systems have their wavelength of illumination fixed, so, as follows:

1) there is transmission through the lens, and
2) the aberrations of the resulting system are fixed, and corrected for a narrow illumination band, which precludes use with polychromatic illumination.

This invention can be employed in mark culling in alignment applications, design of marks for alignment systems, and quality control. The culling involves inspecting marks and when the mark is found to be defective, skipping the mark. In terms of quality control, the selection of the best mark can be made such that the least signal asymmetry is obtained. In the case of mark design, the system can be operated with one mark and then another until the least signal asymmetry is obtained, so that one can determine which mark provides the least signal asymmetry.

Industrial Applicability

Manufacturers of critical dimension measurement equipment or photolithography equipment or manufacturers of steppers and O/L measurement systems would find use for this invention.

I claim:

1. A method of estimating the centerline of an alignment/overlay measurement target comprises the steps as follows:
   a) applying illumination from an illumination source to said target while adjusting the wavelength of said illumination,
   b) performing optical observation of alignment/overlay measurement of said target in which turing adjustment of said wavelength of said illumination is employed to expose an observed feature, and
   c) computing a criterion of signal asymmetry and
   d) tuning said illumination source until said criterion of signal asymmetry is minimized.

2. A method of estimating the centerline of an alignment/overlay measurement target by means of the steps as follows:
   a) projecting light from a tunable, variable wavelength illumination source onto said target,
   b) performing optical observation of said target and providing an output signal representing the quantity measured in said observation,
   c) computing from said output signal a criterion of signal asymmetry to provide an output product, and
   d) tuning said tunable illumination source as a function of said output product,
whereby tuning adjustment of the wavelength of said illumination source is employed to expose and observed feature, and said illumination source is tuned until said criterion of asymmetry is minimized.

3. Apparatus for estimating the centerline of an alignment/overlay measurement mark on a workpiece comprising
   a) a tunable, variable wavelength illumination source having an input terminal,
   b) means for projecting light from said illumination source onto said measurement mark,
   c) sensing means for performing optical observation of said measurement mark and providing an output signal,
   d) means for computing a criterion of signal asymmetry having an output and having an input connected to said sensing means for receiving said output signal from said sensing means, said output being connected to said input terminal of said illumination source,
   e) said means for computing providing on said output a tuning signal to said input terminal of said tunable illumination source,
whereby tuning adjustment of the wavelength of said illumination source is employed to expose an observed feature, and said illumination source is tuned until said criterion of asymmetry is minimized.

* * * * *